United States Patent
Chanda et al.

(10) Patent No.: US 7,749,778 B2
(45) Date of Patent: Jul. 6, 2010

(54) ADDRESSABLE HIERARCHICAL METAL WIRE TEST METHODOLOGY

(75) Inventors: Kaushik Chanda, Fishkill, NY (US); Lawrence Clevenger, LaGrangeville, NY (US); Timothy J. Dalton, Ridgefield, CT (US); Louis L. C. Hsu, Fishkill, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 703 days.

(21) Appl. No.: 11/619,307

(22) Filed: Jan. 3, 2007

(65) Prior Publication Data

US 2008/0160656 A1 Jul. 3, 2008

(51) Int. Cl.
*H01L 21/66* (2006.01)
(52) U.S. Cl. .................. 438/17; 438/4; 438/5; 438/10; 438/11; 438/12; 438/13; 438/14; 438/16; 438/18; 438/765; 438/927; 438/647; 438/629; 257/E21.521; 257/48; 257/528; 257/758; 257/773; 257/776; 257/66; 257/754; 257/755; 324/719; 324/756; 324/525
(58) Field of Classification Search ............... 438/4–5, 438/10–14, 16–18, 765, 927, 647, 629; 257/E21.521, 257/48, 528, 758, 773, 776, 754–755, 66; 324/718–719, 158.1, 756–763, 525, 538, 324/501, 537; 361/385
See application file for complete search history.

(56) References Cited

U.S. PATENT DOCUMENTS

| | | | |
|---|---|---|---|
| 4,918,377 A * | 4/1990 | Buehler et al. ............... 324/691 |
| 5,051,690 A * | 9/1991 | Maly et al. ................... 324/537 |
| 5,264,377 A | 11/1993 | Chesire et al. |
| 5,514,974 A | 5/1996 | Bouldin |
| 5,739,587 A * | 4/1998 | Sato ........................... 257/758 |
| 5,889,410 A * | 3/1999 | El-Kareh et al. ............ 324/769 |
| 5,994,777 A * | 11/1999 | Farrar ......................... 257/758 |
| 6,054,721 A * | 4/2000 | Milor .......................... 257/48 |
| 6,147,361 A * | 11/2000 | Lin et al. ..................... 257/48 |
| 6,362,634 B1 * | 3/2002 | Jarvis et al. ................. 324/719 |
| 6,424,028 B1 * | 7/2002 | Dickinson ................... 257/678 |
| 6,426,516 B1 * | 7/2002 | Sloman ....................... 257/48 |
| 6,498,385 B1 * | 12/2002 | Daubenspeck et al. ...... 257/529 |
| 6,521,910 B1 * | 2/2003 | Lin ............................. 257/48 |
| 6,524,942 B2 * | 2/2003 | Tsai et al. ................... 438/612 |
| 6,559,544 B1 * | 5/2003 | Roth et al. .................. 257/758 |
| 6,756,675 B1 * | 6/2004 | Tanaka ....................... 257/758 |
| 6,842,028 B2 * | 1/2005 | Song et al. .................. 324/763 |
| 6,879,015 B2 * | 4/2005 | Liang et al. ................. 257/459 |
| 6,955,981 B2 * | 10/2005 | Lee et al. .................... 438/612 |
| 7,024,642 B2 * | 4/2006 | Hess et al. ................... 716/4 |
| 7,078,248 B2 * | 7/2006 | Cohn et al. .................. 438/17 |

(Continued)

OTHER PUBLICATIONS

Technology Reliability Qualification of a 65nm CMOS Cu/Low-k BEOL Interconnect, chen et al., IBM Microlelectronics, 2006.*

*Primary Examiner*—Fernando L Toledo
*Assistant Examiner*—Ankush k Singal
(74) *Attorney, Agent, or Firm*—Kenneth R. Corsello, Esq.

(57) ABSTRACT

A method of monitoring and testing electro-migration and time dependent dielectric breakdown includes forming an addressable wiring test array, which includes a plurality or horizontally disposed metal wiring and a plurality of segmented, vertically disposed probing wiring, performing a single row continuity/resistance check to determine which row of said metal wiring is open, performing a full serpentine continuity/resistance check, and determining a position of short defects.

1 Claim, 4 Drawing Sheets

U.S. PATENT DOCUMENTS

| | | | | |
|---|---|---|---|---|
| 7,119,545 B2 * | 10/2006 | Ahsan et al. | | 324/519 |
| 7,129,101 B2 * | 10/2006 | Schultz et al. | | 438/18 |
| 7,180,318 B1 * | 2/2007 | Mahoney et al. | | 324/761 |
| 7,394,261 B2 * | 7/2008 | Park et al. | | 324/537 |
| 7,446,029 B2 * | 11/2008 | Saito | | 438/612 |
| 7,495,288 B2 * | 2/2009 | Matsunaga et al. | | 257/355 |
| 2004/0155316 A1 * | 8/2004 | Saito et al. | | 257/536 |
| 2005/0073058 A1 * | 4/2005 | Kuo et al. | | 257/786 |
| 2006/0246611 A1 * | 11/2006 | Cheong et al. | | 438/14 |
| 2007/0080464 A1 * | 4/2007 | Goebel et al. | | 257/774 |
| 2007/0103173 A1 * | 5/2007 | Cranford et al. | | 324/713 |
| 2007/0229100 A1 * | 10/2007 | Miller | | 324/754 |

* cited by examiner

ADDRESSABLE HIERARCHICAL METAL WIRE TEST METHODOLOGY

BACKGROUND OF THE INVENTION

1. Field of the Invention

The present invention generally relates to a method and apparatus for monitoring and testing electro-migration (EM) and time dependent dielectric breakdown (TDDB), and more particularly to a method and apparatus for addressable wiring test array formed using only back-end-of-the-line (BEOL) metal wiring levels.

2. Description of the Related Art

Generally, two types of tests are conducted on the metal wiring of a chip. The first one is called TDDB (time dependent dielectric breakdown), and the second one is the EM (electro-migration) test.

The purpose of TDDB test is to find out whether the quality of the insulator used for the BEOL (back-end-of-the-line) meets specifications. This test is done by stressing metal wiring in the BEOL at different voltages. One example is to apply a voltage ranged between 5 and 35 volts on the testing metal wire and the adjacent probing metal wire. The time required for electrical breakdown of the insulator is measured and recorded. In some cases, the voltage applied is slightly less than the intrinsic breakdown strength of the insulator. In other cases, tests are done below 12.5 volts. A successful test is usually defined by no breakdown up to 1000 hours of stressing. This means that the leakage current is below $10^{-6}$ A during the whole test period.

On the other hand, the purpose of electro-migration (EM) stressing is to determine if a conducting line can carry a predetermined amount of current without an electrical opening being created in the line by current induced diffusion of the conducting material. With this test, a high current density e.g. 16 m Å/um is driven through a single test line at certain temperature, e.g. 295° C., and the time, e.g. 200 hours, for an electrical open to be created is measured. As long as this time is longer than required by usage requirements, then the test is considered successful. For an EM test, the shorts to the adjacent probing wiring are also recorded. To ensure high metal wiring quality, it is demanded that metal in the BEOL passes these two tests.

Electro-migration has long been identified as the major metal failure mechanism. It is one of the worst reliability concerns for very-large-scale-integration (VLSI) manufacturing since 1960. The problem not only needs to be overcome during fabrication period in order to qualify the process, but it also persists through the lift time of the chip. Voids are created inside of the metal conductors due to metal ion movement caused by high density of current flow.

In short, electro-migration failure is caused by a positive divergence of the ionic flux leads to an accumulation of vacancies, forming void in the metal. It appears that ions are moved "downstream" by the force of "electron wind". Electro-migration and its related failures therefore can be categorized as a wear-out mechanism. In general, the failure rate is proportional to current density and the surrounding temperature.

The EM problem becomes worse as the feature sizes both in width and thickness of metal wirings are further scaled. The current density can easily exceed 1E5 amps/cm 2 for wires with lack of sufficient cross-sectional area. It was observed, when metal lines cross over steep corners with topology tend to be thinner than normal. These corner regions as well as via structures are the most common locations for EM to take place. Proposed methods to slow down the EM effect including: (1) adding copper (0.5-4%) into Al film, (2) adding Ti (0.1-0.5%) into the Al film, (3) using CVD tungsten metal studs (4) using diffusion barrier liners, etc.

Several conventional methods to monitor and test electro-migration and TDDB have been developed. Certain exemplary conventional methods are described below.

Acceleration EM tests carried out using high current, voltage and temperature stress can screen out the defective chips in a relative short period of time. Several methods have been proposed to teach how to conduct such EM test.

A method to measure EM effect uses an EM sensor having a poly-silicon body, a monitored metal piece, and two electrodes. The electrodes are used to probe the connectivity of an EM sensor built by using an intrinsic poly-silicon element. A long metal that is placed on top of the sensor is stressed by a high voltage. When EM mechanism occurs within the metal, the resulting local joule heating will cause the mobility of the senor to drastically increase. This is an indirect measurement of EM. It doesn't test metal with topology with corners and via contact regions. It fails to locate the open/short defects. Furthermore, it requires a poly-silicon layer, which means more process steps and is thus more expensive to make the test macro.

An alternative method to test metal wirings is to directly measure the resistance of a test structure formed by metal wiring. Such a test structure is designed to measure wire resistance in terms of voltage drop after a period of high-voltage and high-temperature stress. This test structure is used to check EM failure and time dependent dielectric breakdown (TDDB) via one metal level. It cannot, however, position the open/short defect location, nor can it count the number of defects in the test macro. Therefore, this method provides very little information about the metal defects.

A similar test structure has been commonly used for the TDDB test in the semiconductor. This test macro includes a long (totally 8 meters) serpentine wirings having minimum ground rule pitch with hundreds of turns and corners. Like the previous method, this method further includes two probing wires Comb-B and Comb-A, which are used to detect the dielectric break down where metal short occurs. For process debugging during development period, it is critical that defect locations can be presented so that failure analysis can be conducted. For such design, however, it is not possible to provide defect locations.

Another alternative conventional method tests metal interconnects containing a plurality of metal segments connected together with vias. The structure is more close to the real life interconnects. The resistance of the test structure is compared to a control structure which is less prone to failure. If the resistance deviation between test and control structures exceeds a certain level, the part fails the test and is then rejected. This is a more direct measurement of EM.

However, all the conventional test methodologies proposed so far can not provide open/short defect address. They may be used to qualify the BEOL process, but it will not be easy for the engineer to spot the defect and zoom in to conduct failure analysis.

SUMMARY OF THE INVENTION

In view of the foregoing and other exemplary problems, drawbacks, and disadvantages of the conventional methods and structures, an exemplary feature of the present invention is to provide a method and structure in which a low-cost, fast turn-around metal test structure which is formed by using only BEOL metal wiring levels.

In a first aspect of the present invention, a method of monitoring and testing electro-migration and time dependent dielectric breakdown, includes forming an addressable wiring test array, said addressable wiring test array including a plurality or horizontally disposed metal wiring, a plurality of segmented, vertically disposed probing wiring disposed between adjacent metal wiring of said plurality of horizontally disposed metal wiring, and a plurality of metal stud connectors connecting said probing wiring, wherein said metal wiring and said probing wiring being formed of a first metal level and said connections being formed of a second metal level, and wherein each probing wiring comprises at least one pad; performing a single row continuity/resistance check to determine which row of said metal wiring is open, said single row continuity/resistance check including sequentially feeding an amount of test current into an input node of each row of said metal wiring, determining which rows of said metal wiring have sufficient connectivity, recording which rows of said metal wiring have an open circuit and connecting ends of said rows of said metal wiring having sufficient connectivity using jumper probe cables to form a serpentine shape; performing a full serpentine continuity/resistance check, said full serpentine continuity/resistance check including testing all of said plurality of metal wiring at once to determine which row of said metal wiring is open; and determining a position of short defects, said determining a position of short defects including holding a first column of said probe wiring at a first voltage level, sequentially activating each row of said metal wiring using a second voltage level to determine if a short defect occurs, recording a location of the short defect, and repeating said holding, said sequentially activating and said recording for each of a plurality of columns of said probe wiring.

Accordingly, the present invention provides a low-cost, fast turn-around metal test structure which is formed by using only BEOL metal wiring level. Furthermore, the present invention provides a defect addressable test macro and a corresponding test algorithm. Additionally, the present invention is useful for high-speed automatic testing tools using test programs.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
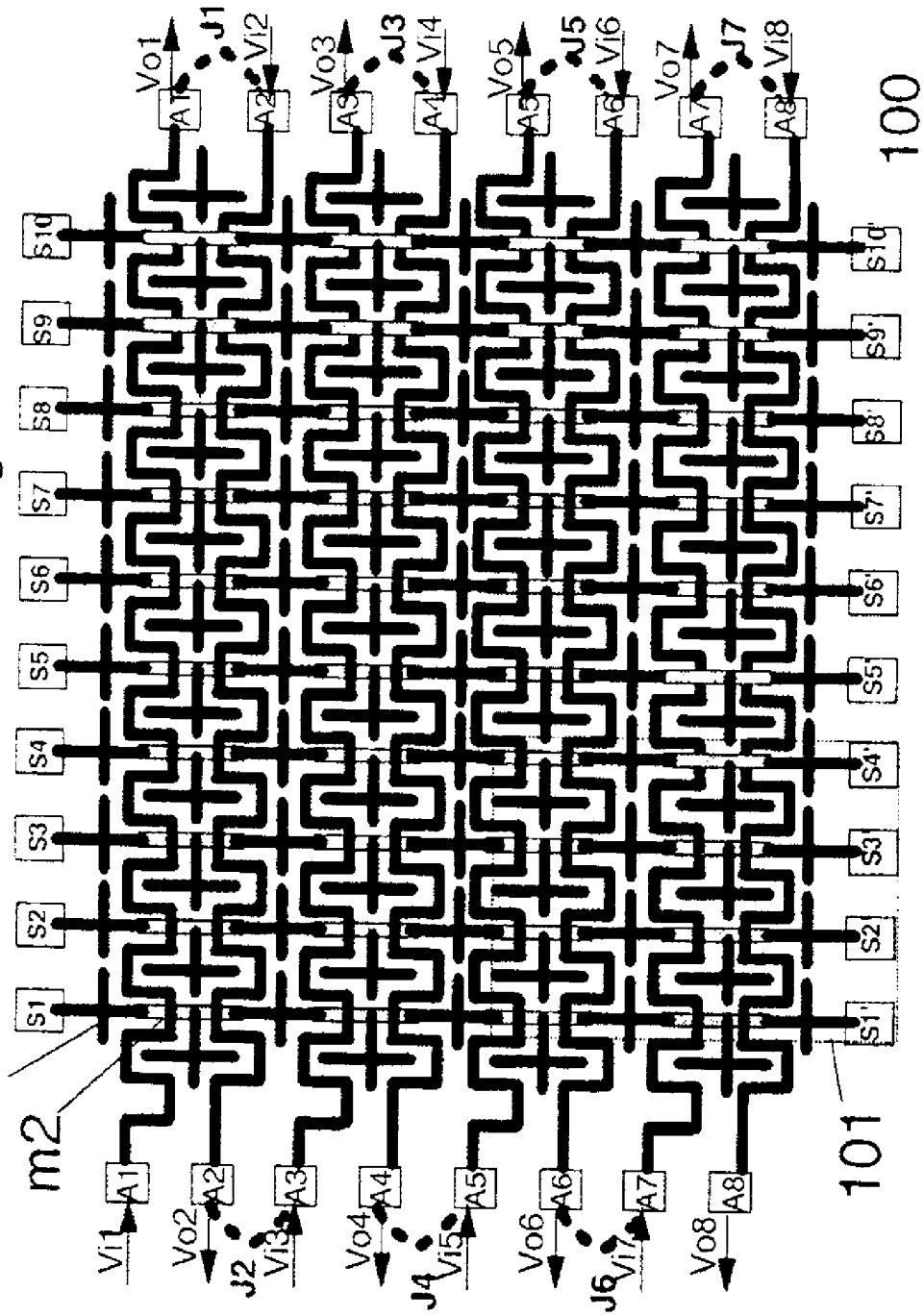
FIG. 1 illustrates an addressable wiring test array (or AWTA) 100 in accordance with certain exemplary embodiments of the present invention.

Referring now to the drawings, and more particularly to FIGS. 1-4C, there are shown exemplary embodiments of the method and structures according to the present invention.

The present invention doesn't attempt to replace the existing TDDB or EM testing methodology. It is important to continue conduct wafer level tests, qualification tests and burn-in test to out stress the bad chips.

An example of the addressable wiring test array (or AWTA) 100 is shown in FIG. 1. A plurality of metal wiring is laid-out in the horizontal direction with or without turns. Each metal wiring can be tested individually with corresponding probe pads. Based on the same principle, it is conceivable that more than one horizontal wire can be joined at the end to have a "u" turn in order to reduce the number of the pads. In between two adjacent metal wirings, segmented probing wirings are presented. A plurality of segmented probing wiring is connected in the vertical direction via next metal level and metal studs.

To ensure that minimum effect is contributed due to the resistance of the metal studs, more than one stud is provided at each contact. In this case, test wirings and segmented probing wires are formed by the first metal level. The connections between segmented probing wires are formed by the second metal level. Each vertical probing wire requires at least one pad so that they can be decoded during testing. For a large array, it is desirable to have two pads for each probe wire so that there will be no voltage drop across the probing wire.

Figure 2:
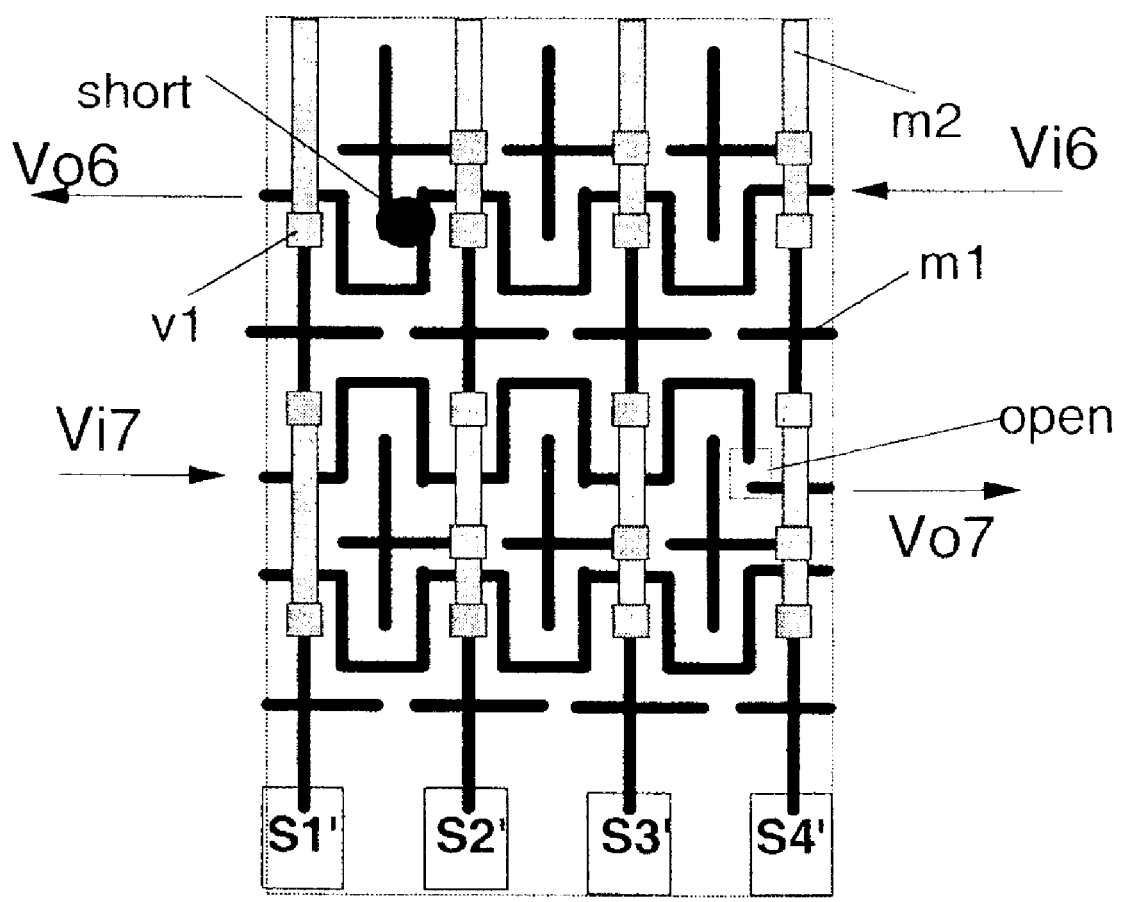
FIG. 2 illustrates an enlarged view of the AWTA 101.

An enlarged diagram 101 of the AWTA indicated in the shaded area is shown in the FIG. 2. Here, three horizontal test wires and four vertical probe wires are illustrated. A short and an open are both shown in this enlarged diagram. The short can be captured by activating the top testing wire and the second probe wires from the left, thus the location can be identified and recorded. The open however can only be addressed by the row. When activating the middle row of the testing wire, the open would cause the node at Vo7 to be at high-Z, or no current flow on the wire.

At least three different addressable tests can be carried out by using this test macro.

First, a single row continuity/resistance check can be performed. This test will give you information such as which row is open. The EM (or TDDB test) test is done by sequentially feeding a proper amount of test current (or voltage) to the input node of each row of the testing wire. If there is an open, then the output node will be at high-Z. If not, then the resistance of the testing wire can be calculated by simple dividing voltage drop by the feeding current. Any row with an open circuit is recorded. After testing is done, the rows with good connectivity are connected at the ends using jumper probe cables to form a serpentine shape.

Second, a full serpentine continuity/resistance check can be performed. This test allows longer metal wirings to be tested at once. While using the conventional structure, even one open defect would invalidate a long wiring stress test. The advantage of the present invention is that one can test the rest of the "good" wiring rows regardless of whether there are some opens presented in the test macro. Jumpers or relays can be used to selectively connect the wiring rows through the existing probe pads A1 to A7, and A1' to A7'.

Third, the short defects can be positioned. In the TDDB test, shorts occur at weak spots where the dielectric fails to hold up with the high voltage. Therefore, after a high voltage stress, the (x,y) location of the shorts can be addressed by holding the first column of probe wire at a first voltage level and sequentially activating each row of the test wire one at a time using a second voltage to check for short. If the short occurs, there will be a net current from the probe wiring to the test wiring, or vice versa, depending on the voltage levels. The tester will record the short address. When the first column is checked, the same procedure is repeated to check for the rest of the columns until the whole array is done and all the locations of the shorts are recorded.

Using conventional testing scheme to test a vast number of interconnects (e.g. millions of contacts and metal segments) the test resolution is limited by the number of the available test pad. For example, a probe pad with a dimension of 90 um×90 um can only be provided to test a group of interconnect, such as in form of serpentine structure. Eventually, the defect can be narrowed down only within a group of interconnects.

The hierarchical test methodology of the present invention proposed allows test engineers to further zoom in on the defect location by an order of magnitude.

Figure 3:
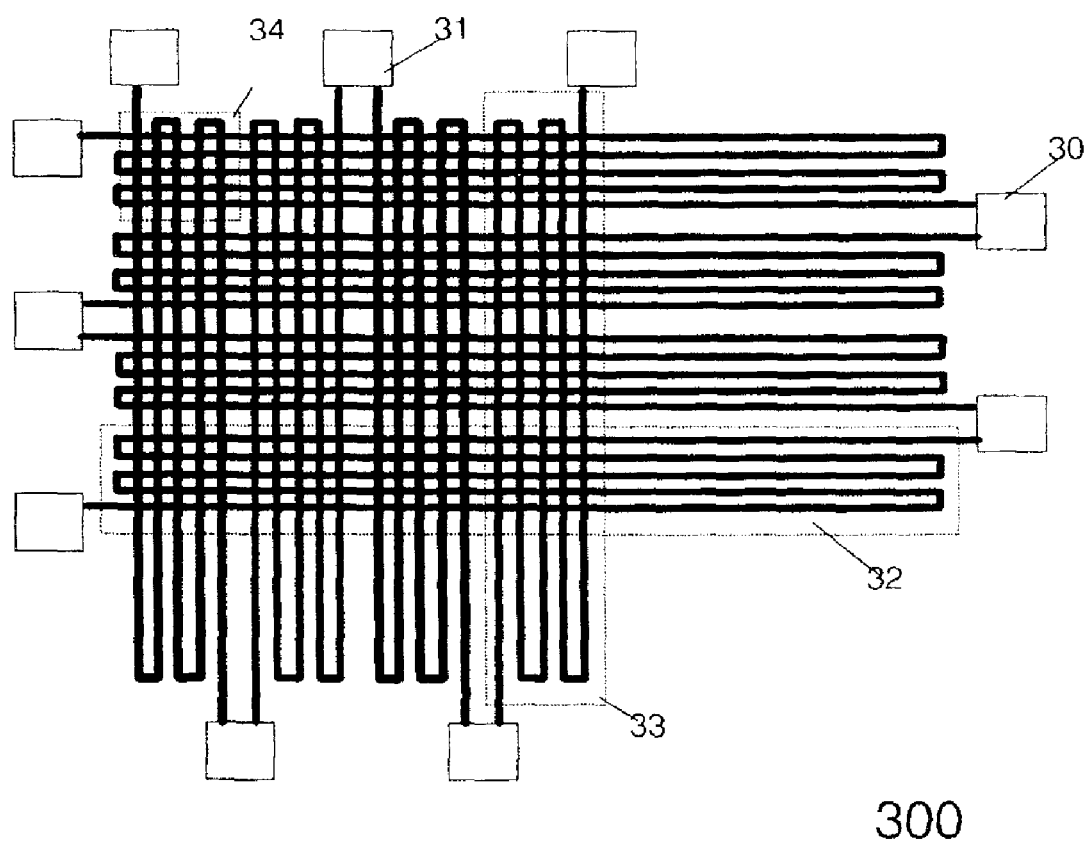
FIG. 3 illustrates a plurality of vertical serpentine interconnects 33 are intersected by another plurality of horizontal serpentine interconnects 32.

As shown in FIG. 3, a plurality of vertical serpentine interconnects 33 are intersected by another plurality of horizontal serpentine interconnects 32. Each serpentine interconnect group includes thousands of first metal segments, second metal segments and interconnects by vias. A plurality of probe pads 31 and 32 are placed at the edges of the wiring array. These pads are used to test the shorts between vertical and horizontal serpentine groups.

By using this arrangement, the defects can be narrowed down into each sub-array indicated by the dotted box 34. This coarse test can be automatically carried out by using any conventional metal test tool with a predetermined test program. The results in terms of which sub-array contains a defect can be recorded.

In order to find out how many defects occur within each defective sub-array that was caught by the automatic testing program, the array should be designed in such a way that a plurality of "pico-probles" are inserted at the boundary of each sub-array. A pico-probe pad having a size as small as 5 um×5 um has been used in testing circuits, especially in the early design period for debugging purpose. Generally, the shape of pico-probe pad can be "V", "U" or "O" so that the probe can be manually inserted and being hold by the pad.

To avoid damaging to the wiring during probing, free running wires in proximity of the probe pads are intentionally avoided in the design. A more detailed top view of a portion of sub-array 34 is illustrated in FIG. 4A. Here, a plurality of pico-probes 40 is placed at the boundary of the sub-array. Since each sub-array can be tested independently, two adjacent pair of wirings share a probe pad. In other words, each sub-array is formed by a mini group of vertical serpentine and another mini group of horizontal serpentine.

In this example, a "U" shape pico-probe pad is adopted. Pico-probe pads are placed on top of vias, which connect to the first metal (dotted lines) wirings underneath. Since there is no free-running wiring presented at the boundary of the sub-array, no damage can be done to the wiring during manual testing. During fine testing, each horizontal and vertical wire can be accessed by the tester and, thus, any single short that occurs inside the sub-array can be detected and recorded.

Figure 4C:
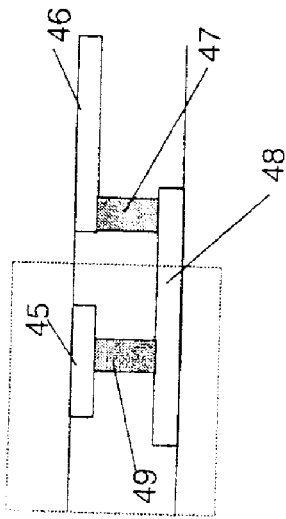
FIGS. 4B and 4C illustrate a perspective view and a cross-sectional view of the pico-probe pad design, respectively.
Figure 4A:
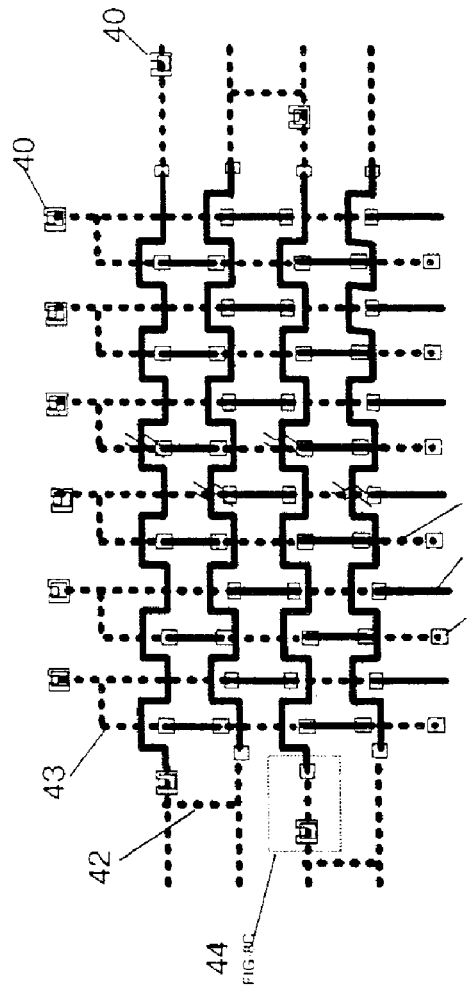
FIG. 4A illustrates a more detailed top view of a portion of the sub-array 34.
Figure 4B:
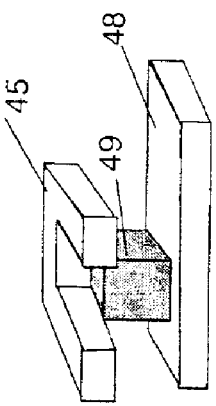

FIGS. 4B and 4C depict a perspective view and a cross-sectional view of the pico-probe pad design, respectively. Here, the "U" shaped pico-probe pad is formed by the second metal 45. It is connected to the first metal wire 48 by a via 49. In this particular example, as shown in FIG. 8C, the horizontal wires inside the sub-array are formed by the second metal 46, where the vertical wires are formed by interconnects of metal segments formed by both metal levels. It is possible, that there can be a variety of options to form such an array and sub-arrays by using two or more metal levels.

The present invention provides an addressable hierarchical wiring test array (AHWTA) macro. This macro can be used for the purposes of debugging and qualifying new BEOL processes. The low-cost test macro requires only two metal levels. It can be used to test any metal level for short and open due to TDDB or EM mechanisms with high resolution. The defects are narrowed down within each sub-array during a high-speed auto testing. The final defect and the locations are mapped by a subsequent semi-auto or manual test.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of monitoring and testing electro-migration and time dependent dielectric breakdown, comprising:
    forming an addressable wiring test array, said addressable wiring test array comprising:
        a plurality or horizontally disposed metal wiring;
        a plurality of segmented, vertically disposed probing wiring disposed between adjacent metal wiring of said plurality of horizontally disposed metal wiring; and
        a plurality of metal stud connectors connecting said probing wiring,
        wherein said metal wiring and said probing wiring being formed of a first metal level and said connections being formed of a second metal level, and
        wherein each probing wiring comprises at least one pad;
    performing a single row continuity/resistance check to determine which row of said metal wiring is open, said single row continuity/resistance check comprising:
        sequentially feeding an amount of test current into an input node of each row of said metal wiring;
        determining which rows of said metal wiring have sufficient connectivity;
        recording which rows of said metal wiring have an open circuit; and
        connecting ends of said rows of said metal wiring having sufficient connectivity using jumper probe cables to form a serpentine shape;
    performing a full serpentine continuity/resistance check, said full serpentine continuity/resistance check comprising:
        testing all of said plurality of metal wiring at once to determine which row of said metal wiring is open;
    determining a position of short defects, said determining a position of short defects comprising:
        holding a first column of said probe wiring at a first voltage level;
        sequentially activating each row of said metal wiring using a second voltage level to determine if a short defect occurs;
        recording a location of the short defect; and
        repeating said holding, said sequentially activating and said recording for each of a plurality of columns of said probe wiring; and
    performing a hierarchical metal wiring test to zoom in on said location of said short defect, said hierarchical metal wiring test comprising:
        interconnecting a plurality of vertical serpentine interconnects and a plurality of horizontal serpentine interconnects;
        placing a plurality of probe pads at edges of said wiring test array to test for short defects between said plurality of vertical serpentine interconnects and said plurality of horizontal serpentine interconnects;
        determining which of a plurality of sub-arrays in said wiring test array contains a short defect; and
        recording which sub-array in said plurality of sub-arrays contains the short defect.

* * * * *